United States Patent
Ouchi

(10) Patent No.: US 9,118,297 B2
(45) Date of Patent: Aug. 25, 2015

(54) ELASTIC WAVE DEVICE AND DUPLEXING DEVICE

(71) Applicant: Murata Manufacturing Co., Ltd., Nagaokakyo-shi, Kyoto-fu (JP)

(72) Inventor: Minefumi Ouchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/600,201

(22) Filed: Jan. 20, 2015

(65) Prior Publication Data

US 2015/0130551 A1    May 14, 2015

Related U.S. Application Data

(63) Continuation of application No. PCT/JP2013/068029, filed on Jul. 1, 2013.

(30) Foreign Application Priority Data

Aug. 2, 2012  (JP) ................. 2012-171559

(51) Int. Cl.
*H03H 9/72* (2006.01)
*H03H 9/64* (2006.01)
*H03H 9/00* (2006.01)

(52) U.S. Cl.
CPC ............. *H03H 9/0038* (2013.01); *H03H 9/008* (2013.01); *H03H 9/6436* (2013.01); *H03H 9/6493* (2013.01); *H03H 9/725* (2013.01)

(58) Field of Classification Search
CPC . H03H 9/0023; H03H 9/0033; H03H 9/0038; H03H 9/64; H03H 9/6423; H03H 9/6433; H03H 9/6436; H03H 9/6489; H03H 9/6493; H03H 9/72; H03H 9/725; H03H 9/008

USPC ........... 333/133, 193, 195; 310/313 B, 313 D
See application file for complete search history.

(56) References Cited

U.S. PATENT DOCUMENTS

2002/0135268 A1*  9/2002  Watanabe ................. 310/313 R
2004/0066115 A1    4/2004  Takamine
(Continued)

FOREIGN PATENT DOCUMENTS

JP    10-224175 A    8/1998
JP    2001-313540 A  11/2001
(Continued)

OTHER PUBLICATIONS

Official Communication issued in International Patent Application No. PCT/JP2013/068029, mailed on Oct. 1, 2013.

*Primary Examiner* — Barbara Summons
(74) *Attorney, Agent, or Firm* — Keating & Bennett, LLP

(57) ABSTRACT

A balanced-unbalanced conversion-type elastic wave device includes an unbalanced signal terminal, first and second balanced signal terminals, and first to fifth interdigital transducers disposed along an elastic wave propagation direction. One end of each of the first, third, and fifth interdigital transducers is connected in common to the unbalanced signal terminal, one end of each of the second interdigital transducer and the fourth interdigital transducer is connected to the first and second balanced signal terminals respectively, a first inductance is connected between the first interdigital transducer and a ground potential, and a second inductance is connected between the fifth interdigital transducer and the ground potential. First and second inductance values of the first and second inductances, respectively, are different.

6 Claims, 8 Drawing Sheets

(56) References Cited

U.S. PATENT DOCUMENTS

| | | |
|---|---|---|
| 2004/0155730 A1 | 8/2004 | Iwamoto et al. |
| 2005/0242903 A1 | 11/2005 | Inoue et al. |
| 2007/0090895 A1 | 4/2007 | Nishizawa et al. |
| 2007/0103254 A1 | 5/2007 | Haruta et al. |
| 2007/0120626 A1 | 5/2007 | Makibuchi et al. |
| 2007/0290770 A1* | 12/2007 | Otsuka et al. ............... 333/193 |
| 2008/0284540 A1* | 11/2008 | Nishihara et al. ............ 333/133 |
| 2010/0066461 A1* | 3/2010 | Yonekura ..................... 333/4 |
| 2010/0109802 A1 | 5/2010 | Tanaka |
| 2010/0150075 A1* | 6/2010 | Inoue et al. .................. 370/328 |
| 2010/0207708 A1 | 8/2010 | Haruta |
| 2014/0111286 A1* | 4/2014 | Taniguchi et al. ........... 333/133 |

FOREIGN PATENT DOCUMENTS

| | | |
|---|---|---|
| JP | 2003-249842 A | 9/2003 |
| JP | 2004-088551 A | 3/2004 |
| JP | 2005-318307 A | 11/2005 |
| JP | 2007-124085 A | 5/2007 |
| JP | 2007-181195 A | 7/2007 |
| JP | 2010-062873 A | 3/2010 |
| JP | 2010-109694 A | 5/2010 |
| WO | 2006/003787 A1 | 1/2006 |
| WO | 2009/113274 A1 | 9/2009 |
| WO | 2009/119016 A1 | 10/2009 |
| WO | 2011/024876 A1 | 3/2011 |
| WO | 2011/152176 A1 | 12/2011 |

* cited by examiner

ELASTIC WAVE DEVICE AND DUPLEXING DEVICE

BACKGROUND OF THE INVENTION

1. Field of the Invention

The present invention relates to elastic wave devices having unbalanced-balanced conversion functions, and particularly relates to elastic wave devices having five IDT-type unbalanced-balanced conversion functions and duplexing devices that use such elastic wave devices.

2. Description of the Related Art

In recent years, duplexers are being connected to antenna terminals in mobile wireless communication applications, such as in cellular phones. A duplexer includes a transmission filter and a reception filter. An unbalanced-balanced filter circuit is used in the reception filter in order to connect to an IC in the next stage.

Japanese Unexamined Patent Application Publication No. 2001-313540 discloses an elastic wave device for configuring this type of unbalanced-balanced filter circuit. FIG. 10 schematically illustrates the circuit configuration of the elastic wave device.

As shown in FIG. 10, an elastic wave device 1001 includes an unbalanced signal terminal 1002, a first balanced signal terminal 1003, and a second balanced signal terminal 1004. The elastic wave device 1001 is a five IDT-type longitudinally coupled resonator-type surface acoustic wave filter. As shown in FIG. 10, first to fifth interdigital transducers (IDTs) 1011 to 1015 are disposed along an elastic wave propagation direction. The first to fifth interdigital transducers 1011 to 1015 are configured so that the phase of a signal obtained at the first balanced signal terminal 1003 and the phase of a signal obtained at the second balanced signal terminal 1004 are opposite from each other.

Meanwhile, Japanese Unexamined Patent Application Publication No. 2003-249842, indicated below, discloses a duplexer that employs an unbalanced-balanced conversion elastic wave filter such as that mentioned above as a reception filter circuit.

FIG. 11 is a block diagram schematically illustrating the duplexer according to Japanese Unexamined Patent Application Publication No. 2003-249842. A duplexer 1021 includes an unbalanced signal terminal 1002 connected to an antenna terminal 1022. A transmission filter 1023 is connected between the unbalanced signal terminal 1002 and a transmission terminal 1025. A reception filter 1024 is connected between the unbalanced signal terminal 1002 and first and second balanced signal terminals 1003 and 1004. Note that a matching circuit 1026 is connected between the reception filter 1024 and the unbalanced signal terminal 1002.

The elastic wave device 1001 has an unbalanced-balanced conversion function such as that described above. However, there has been a problem in that when the elastic wave device 1001 is used, differential transmission characteristics, including isolation characteristics, between transmitted signals and received signals have been insufficient. This will be described with reference to FIGS. 12 and 13.

In FIG. 12, the solid line indicates amplitude characteristics between the unbalanced signal terminal 1002 and the second balanced signal terminal 1004 in the elastic wave device 1001, whereas the broken line indicates amplitude characteristics between the unbalanced signal terminal 1002 and the first balanced signal terminal 1003. As is clear from FIG. 12, the amplitude characteristics differ between the two. The reason for this is as follows. An electrical signal obtained from the first balanced signal terminal 1003 and an electrical signal obtained from the second balanced signal terminal 1004 have opposite phases. However, signals transmitted in a bridged manner between the unbalanced signal terminal 1002 and the first and second balanced signal terminals 1003 and 1004 have the same phase. Accordingly, in the case where the signals transmitted in a bridged manner have the same phase as the electrical signal flowing from the unbalanced signal terminal 1002 to the second balanced signal terminal 1004, for example, the signals will strengthen each other. In this case, the signal flowing from the unbalanced signal terminal 1002 to the first balanced signal terminal 1003 has a phase opposite from the stated signals transmitted in a bridged manner, and thus these signals will weaken each other. A difference in amplitude characteristics between the signal obtained from the first balanced signal terminal 1003 and the signal obtained from the second balanced signal terminal 1004 will arise as a result, as shown in FIG. 12. This difference is more marked in higher frequencies.

Assume now that the duplexer shown in FIG. 11 is configured using the elastic wave device 1001 as a reception filter circuit. In this case, the amplitude characteristics of the signal transmitted from the transmission terminal 1025 to the first balanced signal terminal 1003 or the signal transmitted from the transmission terminal 1025 to the second balanced signal terminal 1004 will be as indicated by the solid line and the broken line shown in FIG. 13. Accordingly, transmission characteristics, isolation characteristics, and so on tend to drop when operating in a differential mode.

SUMMARY OF THE INVENTION

Preferred embodiments of the present invention provide an elastic wave device having an unbalanced-balanced conversion function capable of reducing a difference between amplitude characteristics between an unbalanced signal terminal and a first balanced signal terminal and amplitude characteristics between the unbalanced signal terminal and a second balanced signal terminal.

Also, various preferred embodiments of the present invention provide a duplexing device capable of improving transmission characteristics and isolation between a transmission side and a reception side when operating in a differential mode.

An elastic wave device according to a preferred embodiment of the present invention is an unbalanced-balanced elastic wave device including an unbalanced signal terminal and first and second balanced signal terminals. The elastic wave device according to a preferred embodiment of the present invention includes a piezoelectric substrate, first to fifth interdigital transducers disposed on the piezoelectric substrate in that order along an elastic wave propagation direction, and first and second reflectors disposed on either side, in the elastic wave propagation direction, of an area in which the first to fifth interdigital transducers are disposed. According to a preferred embodiment of the present invention, one end of each of the first, third, and fifth interdigital transducers is connected in common to the unbalanced signal terminal, one end of the second interdigital transducer is connected to the first balanced signal terminal, one end of the fourth interdigital transducer is connected to the second balanced signal terminal, and the other end of each of the first to fifth interdigital transducers is connected to a ground potential.

A signal obtained from the first balanced signal terminal and a signal obtained from the second balanced signal terminal have opposite phases. An unbalanced-balanced conversion function is realized as a result.

According to a preferred embodiment of the present invention, the device further includes first and second inductances respectively connected between the other ends of the first and fifth interdigital transducers and the ground potential. The respective other ends of the first and fifth interdigital transducers are electrically insulated on the piezoelectric substrate. A first inductance value L1 of the first inductance and a second inductance value L2 of the second inductance are different.

According to a specific aspect of the elastic wave device according to a preferred embodiment of the present invention, the first inductance is provided between the ground potential and the other end of the first interdigital transducer disposed so as to have the same phase as a signal inputted to the unbalanced signal terminal, the second inductance is provided between the ground potential and the other end of the fifth interdigital transducer disposed so as to have the opposite phase from the unbalanced terminal, and the inductance value L1 of the first inductance is lower than the inductance value L2 of the second inductance. In this case, the positions of attenuation poles in amplitude characteristics of signals obtained from the first and second balanced signal terminals are made different. Accordingly, the difference in amplitude characteristics between the first and second balanced signal terminals is reduced even further.

According to another specific aspect of the elastic wave device according to a preferred embodiment of the present invention, the first inductance value L1 of the first inductance has the same phase as the signal inputted to the unbalanced signal terminal, the second inductance value L2 of the second inductance has the opposite phase from the signal inputted to the unbalanced signal terminal, and the inductance value L1 is lower than the inductance value L2.

According to yet another specific aspect of the elastic wave device according to a preferred embodiment of the present invention, the elastic wave device further includes a first capacitance C1 connected between the unbalanced signal terminal and the first balanced signal terminal that outputs a signal having the same phase as the signal inputted to the unbalanced signal terminal, and a second capacitance C2 connected between the unbalanced signal terminal and the second balanced signal terminal that outputs a signal having the opposite phase from the signal inputted to the unbalanced signal terminal, and the capacitance C1 is lower than the capacitance C2.

A duplexing device according to a preferred embodiment of the present invention includes an antenna terminal, a transmission filter circuit connected to the antenna terminal, and a reception filter circuit connected to the antenna terminal. Here, the reception filter circuit includes the elastic wave device configured according to a preferred embodiment of the present invention.

In the elastic wave device according to a preferred embodiment of the present invention, the first and second inductances are connected between the first and fifth interdigital transducers and the ground potential, and the inductance values are different between the first inductance and the second inductance, which makes it possible to adjust the amplitude characteristics between the first and second balanced signal terminals. Accordingly, setting the first and second inductance values L1 and L2 so that the respective amplitude characteristics are close to each other makes it possible to reduce the different between the amplitude characteristics as compared to a configuration in which the first and second inductances are not connected.

The duplexing device according to a preferred embodiment of the present invention includes the elastic wave device according to a preferred embodiment of the present invention as a reception filter circuit, and thus transmission characteristics and isolation characteristics are significantly improved in a differential mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

Figure 1A:
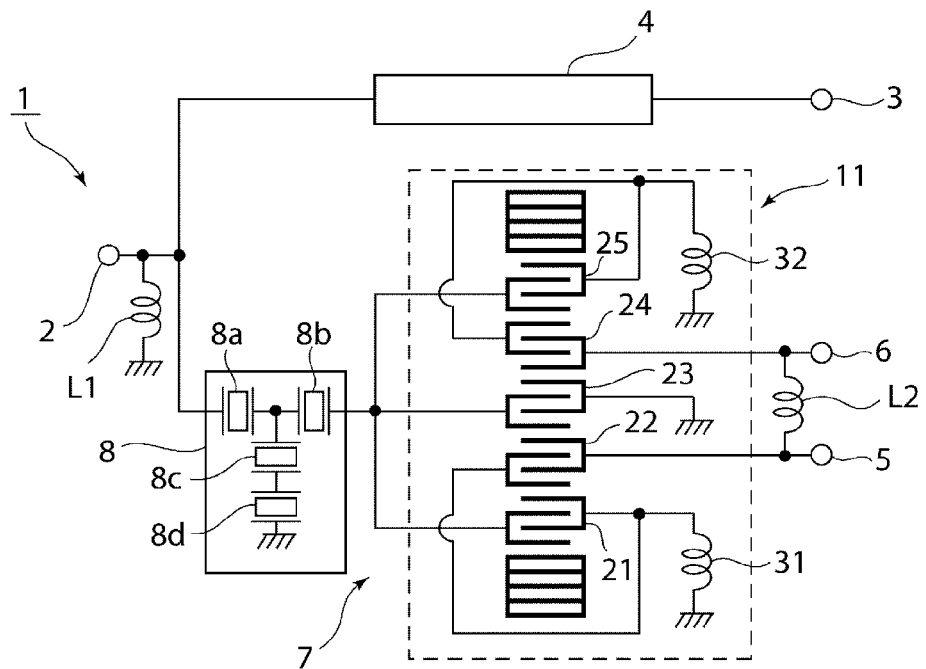
FIG. 1A is a general circuit diagram illustrating a duplexing device according to a first preferred embodiment of the present invention.

FIG. 1A is a general circuit diagram illustrating a duplexing device according to a first preferred embodiment of the present invention.

A duplexing device 1 preferably includes an unbalanced signal terminal 2 that is configured to connect to an antenna. An antenna terminal matching inductance L1 is connected between the unbalanced signal terminal 2 and a ground potential.

A transmission filter circuit 4 is connected between the unbalanced signal terminal 2 and a transmission terminal 3. A reception filter circuit 7 is connected between the unbalanced signal terminal 2 and first and second balanced signal terminals 5 and 6. Note that a phase adjustment circuit 8 is connected between the unbalanced signal terminal 2 and the reception filter circuit 7.

The first and second balanced signal terminals 5 and 6 define and function as first and second reception terminals, respectively. The reception filter circuit 7 is configured of an elastic wave device according to a preferred embodiment of the present preferred embodiment.

Figure 1B:
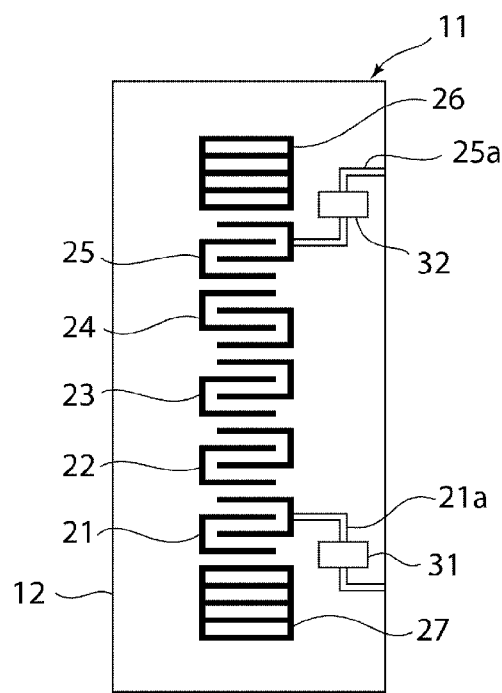
FIG. 1B is a schematic plan view illustrating an elastic wave device included in this preferred embodiment of the present invention.

FIG. 1B is a schematic plan view illustrating an elastic wave device 11, indicated by a broken line in FIG. 1A.

The elastic wave device 11 is a five IDT-type longitudinally coupled resonator-type surface acoustic wave filter. Note that a boundary acoustic wave filter may be used instead of a surface acoustic wave filter, for example.

As shown in FIG. 1B, the elastic wave device 11 includes a piezoelectric substrate 12. First to fifth interdigital transducers 21 to 25 are disposed in that order on the piezoelectric substrate 12 along a propagation direction of the surface acoustic wave. Reflectors 26 and 27 are disposed on either side of the first to fifth interdigital transducers 21 to 25 in the propagation direction of the surface acoustic wave.

Returning to FIG. 1A, one end of each of the first, third, and fifth interdigital transducers 21, 23, and 25 are connected in common, and are connected to the unbalanced signal terminal 2. The one end of the second interdigital transducer 22 is connected to the first balanced signal terminal 5. The one end of the fourth interdigital transducer 24 is connected to the second balanced signal terminal 6. The other end of each of the first to fifth interdigital transducers 21 to 25 is connected to a ground potential.

A reception terminal matching inductance L2 is connected between the first balanced signal terminal 5 and the second balanced signal terminal 6.

A signal inputted from the unbalanced signal terminal is supplied to the reception filter circuit 7 via the phase adjustment circuit 8. A received signal is obtained from the first balanced signal terminal 5 and the second balanced signal terminal 6. Here, the first to fifth interdigital transducers 21 to 25 are configured so that the phase of a signal obtained from the first balanced signal terminal 5 and the phase of a signal obtained from the second balanced signal terminal 6 are opposite from each other. The five IDT-type unbalanced-balanced elastic wave device is known, as disclosed in Japanese Unexamined Patent Application Publication No. 2001-313540.

In the present preferred embodiment, however, a first inductance 31 is connected between the first interdigital transducer 21 and a ground potential, and a second inductance 32 is connected between the fifth interdigital transducer 25 and the ground potential.

In the present preferred embodiment, interconnects 21a and 25a are provided on the piezoelectric substrate 12 so as to connect the respective other ends of the first interdigital transducer 21 and the fifth interdigital transducer 25 to the ground potential. The first and second inductances 31 and 32 are inserted midway along the interconnects 21a and 25a, respectively. The interconnect 21a and the interconnect 25a are electrically insulated on the piezoelectric substrate 12.

The first and second inductances 31 and 32 preferably are configured as coil patterns on the piezoelectric substrate 12. The interconnects 21a and 25a preferably extend to a bottom surface of the piezoelectric substrate 12. In this case, the configuration may be such that the coil patterns are provided on the bottom surface of the piezoelectric substrate 12.

The first and second inductances 31 and 32 can be configured as any suitable conductive pattern, aside from a coil pattern, that provides inductance.

Note that the first and second inductances 31 and 32 may be configured of external inductance components provided outside the elastic wave device 11. In this case, the interconnects 21a and 25a may be divided midway, and the external inductance components may then be connected between the divided interconnect portions.

In the present preferred embodiment, the first inductance value L1 of the first inductance 31 and the second inductance value L2 of the second inductance 32 are different. More specifically, in the case where a structure having the same configuration with the exception of the first and second inductances 31 and 32, which are not connected, is taken as a comparative example, the first inductance value L1 and the second inductance value L2 are set to different values so that a difference in the amplitude characteristics of the signals obtained from the first and second balanced signal terminals 5 and 6 is lower than in the comparative example. According to the present preferred embodiment, there is a smaller difference between the amplitude characteristics of the signal obtained from the first balanced signal terminal 5 and the amplitude characteristics of the signal obtained from the second balanced signal terminal 6, which makes it possible to effectively improve transmission characteristics and isolation characteristics in a differential mode. This will be described later with reference to FIGS. 3 to 5.

Figure 2:
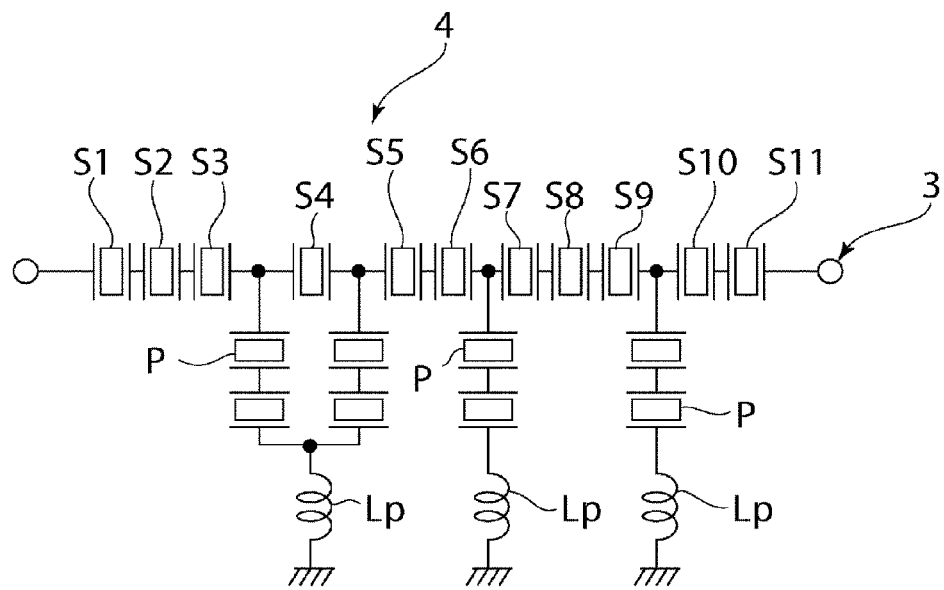
FIG. 2 is a circuit diagram illustrating a transmission filter circuit included in the first preferred embodiment of the present invention.

FIG. 2 illustrates the transmission filter circuit 4 in the duplexing device 1. The transmission filter circuit 4 is configured of a ladder-type surface acoustic wave filter. The transmission filter circuit 4 includes a serial arm that is electrically connected between an antenna terminal and a transmission-side signal terminal. In the serial arm, a plurality of serial arm resonators S1 to S11 are electrically connected in series. A plurality of parallel arms are electrically connected between the serial arm and the ground potential. A parallel arm resonator P is provided in each of the plurality of parallel arms. Each serial arm resonator and each parallel arm resonator is configured of a surface acoustic wave resonator including a single interdigital transducer electrode and a pair of reflectors disposed on either side of the interdigital transducer electrode in the propagation direction of the surface acoustic wave. An inductance Lp is connected between each parallel arm resonator and a ground potential.

Although not particularly limited, the phase adjustment circuit 8 has, in the present preferred embodiment, resonators 8a and 8b that are connected to each other in series between the unbalanced signal terminal 2 and the reception filter circuit 7. Resonators 8c and 8d are connected to each other in series between the ground potential and the point of connection between the resonators 8a and 8b.

In the duplexing device according to the first preferred embodiment as described thus far, the elastic wave device 11 that configures the reception filter circuit 7 is preferably configured as described below.

A five-IDT longitudinally coupled resonator-type filter was preferably used. In order to adjust the phase and RX characteristics, on the antenna terminal side, resonators were connected in series between the antenna terminal and the elastic wave device 11, and a resonator was connected between a ground potential and the point of connection between the resonators connected in series.

The first inductance value L1 preferably was set to about 0.01 nH, and the second inductance value L2 was preferably set to about 0.1 nH, for example.

For comparative purposes, a duplexing device serving as a comparative example, including an elastic wave device having the same configuration as described above aside from the inductance values of the first and second inductances 31 and 32 both being set to about 0.01 nH, was manufactured in the same manner.

Figure 3:
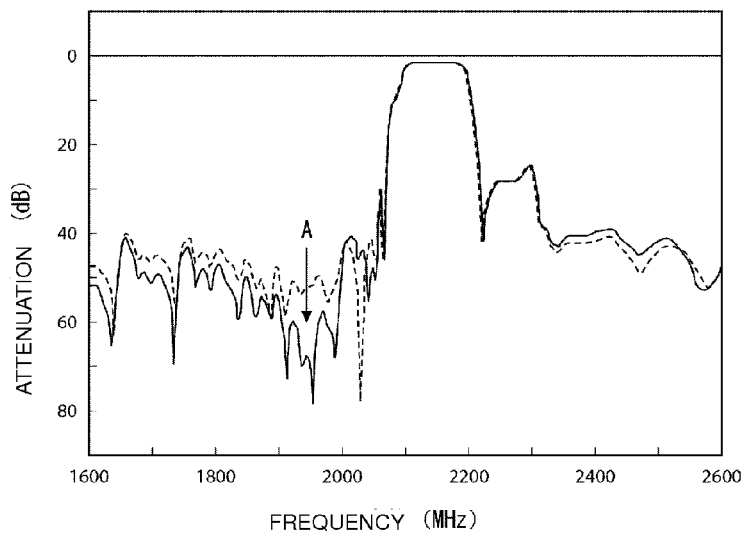
FIG. 3 is a diagram illustrating differential characteristics in signals from an unbalanced signal terminal to first and second balanced signal terminals in the duplexing device according to the first preferred embodiment of the present invention, and differential characteristics in a duplexing device according to a comparative example.

In FIG. 3, the solid line indicates differential characteristics from the unbalanced signal terminal 2 to the first and second balanced signal terminals 5 and 6 according to the aforementioned preferred embodiment of the present invention, whereas the broken line indicates the same differential characteristics according to the comparative example.

As can be seen in FIG. 3, the differential characteristics are improved in the present preferred embodiment of the present invention as compared to the comparative example. In other words, as indicated by an arrow A in FIG. 3, it can be seen that the differential characteristics have been effectively improved outside of a pass-band.

Figure 4:
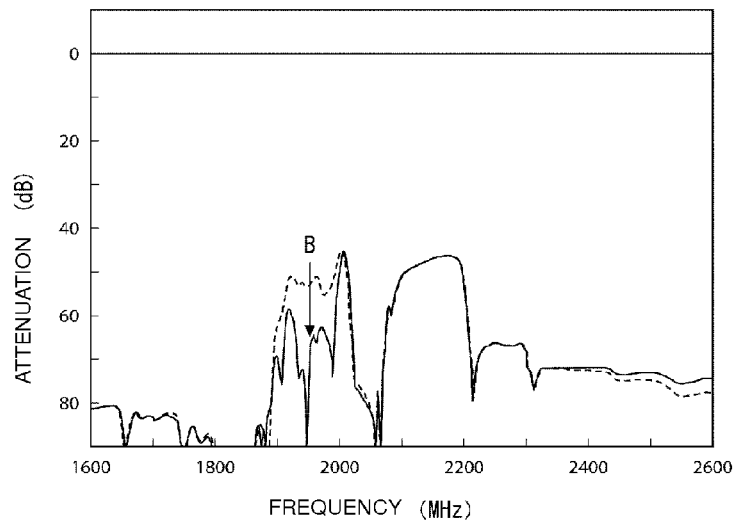
FIG. 4 is a diagram illustrating differential characteristics from a transmission side to a reception side in the duplexing device according to the first preferred embodiment of the present invention and in a conventional duplexing device.

In FIG. 4, the solid line indicates differential characteristics from the transmission side to the reception side according to the aforementioned preferred embodiment of the present invention, whereas the broken line indicates differential characteristics from the transmission side to the reception side according to the aforementioned comparative example. As indicated by an arrow B in FIG. 4, it can be seen that the aforementioned preferred embodiment of the present invention effectively improves the differential characteristics from the transmission side to the reception side.

Figure 5:
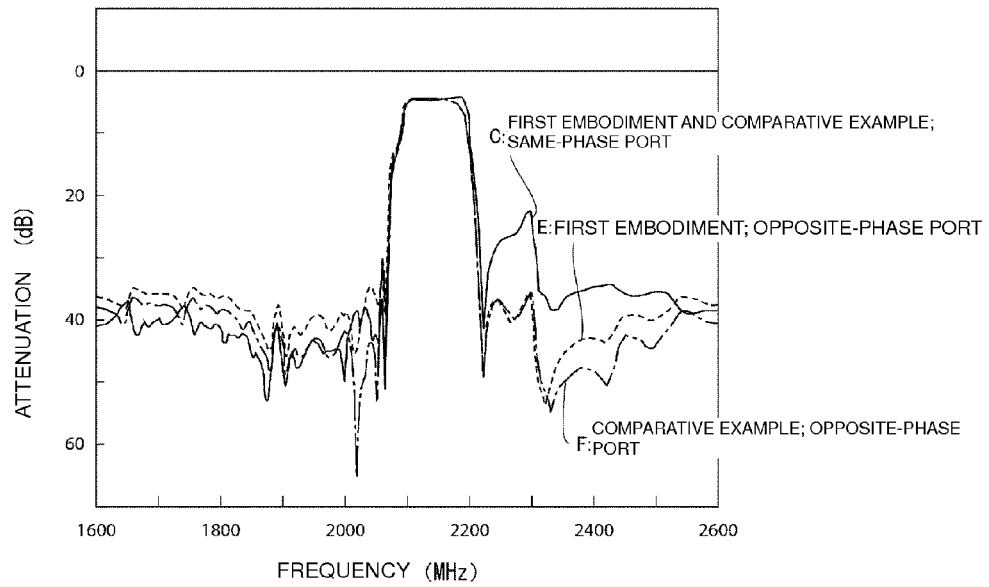
FIG. 5 is a diagram illustrating frequency characteristics for each of the first balanced signal terminal that has the same phase as the unbalanced signal terminal and the second balanced signal terminal that has the opposite phase from the unbalanced signal terminal in the duplexing device according to the first preferred embodiment of the present invention, and illustrating frequency characteristics for each of a first balanced signal terminal that has the same phase as an unbalanced signal terminal and a second balanced signal terminal that has the opposite phase from the unbalanced signal terminal in a conventional duplexing device.

In FIG. 5, the solid line labeled C indicates amplitude characteristics between the unbalanced signal terminal and the first balanced signal terminal 5, which is a port having the same phase, in the duplexing device according to the present preferred embodiment. Note that amplitude characteristics between the unbalanced signal terminal 2 and the first balanced signal terminal 5, which is a port having the same phase, according to the comparative example overlap with the amplitude characteristics according to the aforementioned preferred embodiment of the present invention and indicated by C. In other words, the amplitude characteristics between the unbalanced signal terminal and the balanced signal terminal that is a port having the same phase are almost the same in the above-described preferred embodiment of the present invention and the comparative example, and are not distinguished from each other in FIG. 5. In FIG. 5, the broken line labeled E indicates frequency characteristics between the unbalanced signal terminal and the second balanced signal terminal 6, which is a port having the opposite phase, in the duplexing device according to the present preferred embodiment. In FIG. 5, the dot-dash line labeled F indicates frequency characteristics between the unbalanced signal terminal 2 and the second balanced signal terminal 6, which is a port having the opposite phase, according to the comparative example.

As can be seen from FIG. 5, there is a lower difference between the amplitude characteristics on the first balanced signal terminal side and the second balanced signal terminal side in a 1600 MHz-2000 MHz frequency band. Accordingly, it can be seen that the lower difference between the amplitude characteristics has improved the differential characteristics and the isolation characteristics, as shown in FIGS. 3 and 4.

Figure 6:
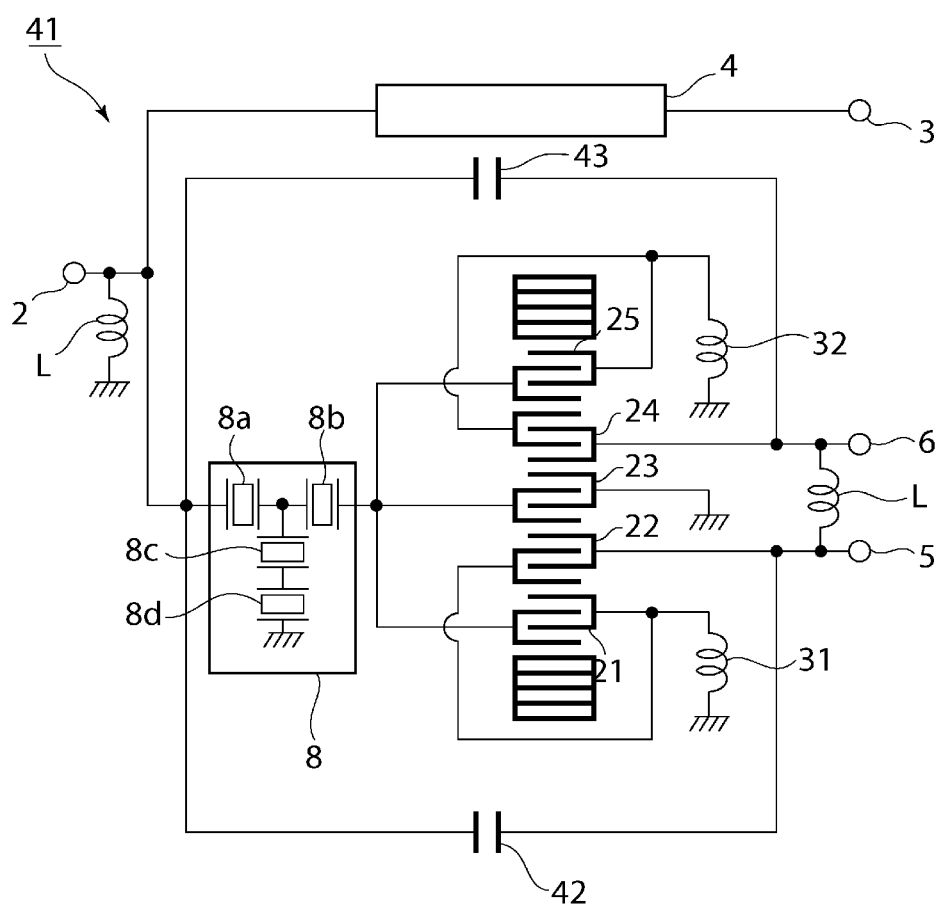
FIG. 6 is an overall configuration diagram illustrating a duplexing device according to a second preferred embodiment of the present invention.

FIG. 6 is an overall configuration diagram illustrating a duplexing device according to a second preferred embodiment of the present invention.

Aside from being provided with first and second capacitances 42 and 43, a duplexing device 41 is the same as in the first preferred embodiment. Accordingly, like elements will be given like reference signs, and the descriptions of the first preferred embodiment will be applied here.

The first capacitance 42 is connected between the unbalanced signal terminal 2 and the first balanced signal terminal 5, and the second capacitance 43 is connected between the unbalanced signal terminal 2 and the second balanced signal terminal 6. In the present preferred embodiment, a first capacity C1 of the first capacitance 42 and a second capacity C2 of the second capacitance 43 are different. Accordingly, the position of an attenuation pole in filter characteristics obtained from the first balanced signal terminal 5 and the position of an attenuation pole in filter characteristics obtained from the second balanced signal terminal 6 preferably are made different. Specifically, to make the positions of the attenuation poles different, the first and second capacities C1 and C2 are selected so as to reduce a difference between the amplitude characteristics of a signal flowing from the unbalanced signal terminal to the first balanced signal terminal 5 and the amplitude characteristics of a signal flowing to the second balanced signal terminal 6, as compared to a configuration where the first and second capacities C1 and C2 are not connected. As such, according to the second preferred embodiment, the first and second capacitances 42 and 43 are provided in addition to the first and second inductances 31 and 32, and thus the difference between the amplitude characteristics on the first balanced signal terminal 5 side and the amplitude characteristics on the second balanced signal terminal 6 side is reduced even further.

The duplexing device 41 according to the second preferred embodiment was preferably manufactured in the same manner as the duplexing device 1 according to the first preferred embodiment.

Note that the first inductance value L1 of the first inductance 31 was preferably set to about 0.01 nH, the second inductance value L2 of the second inductance 32 preferably was set to about 0.2 nH, the first capacity C1 of the first capacitance 42 was preferably set to 0 pF, and the second capacity C2 of the second capacitance 43 was preferably set to about 0.01 pF, for example. The comparative example described in the first preferred embodiment was prepared for comparative purposes. In other words, a configuration in which L1=L2=about 0.01 nH and the first and second capacitances 42 and 43 are not provided was used as the comparative example.

Figure 7:
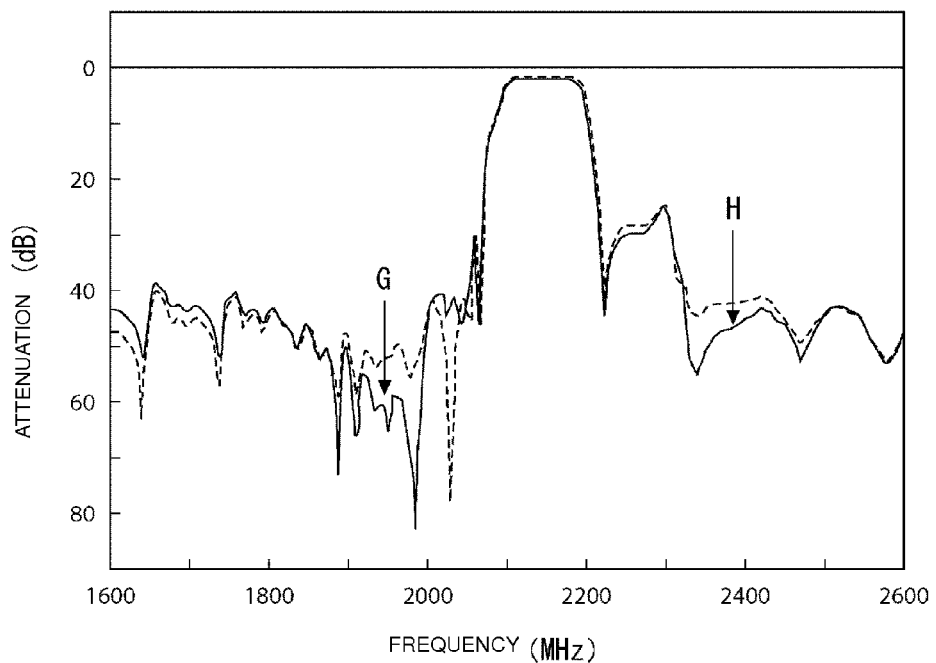
FIG. 7 is a diagram illustrating differential characteristics between an unbalanced signal terminal and first and second balanced signal terminals in a duplexing device according to the second preferred embodiment of the present invention and in a duplexing device according to a comparative example.

In FIG. 7, the solid line indicates differential characteristics of a signal flowing from the unbalanced signal terminal 2 to the first and second balanced signal terminals 5 and 6 in the duplexing device 41 according to the second preferred embodiment, whereas the broken line indicates the same differential characteristics according to the comparative example. As indicated by arrows G and H in FIG. 7, it can be seen that the differential characteristics have been greatly improved outside a pass-band in the second preferred embodiment, as compared to the comparative example.

Figure 8:
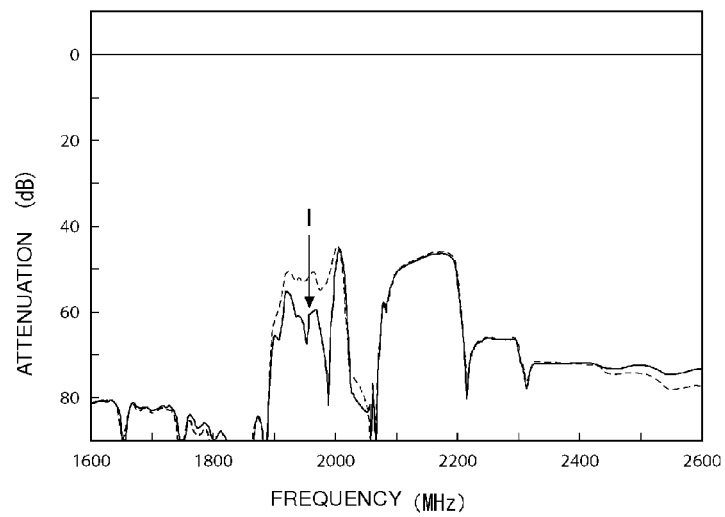
FIG. 8 is a diagram illustrating differential characteristics from a transmission side to a reception side in the duplexing device according to the second preferred embodiment of the present invention and in a duplexing device according to a comparative example.

In FIG. 8, the solid line indicates differential characteristics from the transmission side to the reception side according to the second preferred embodiment, whereas the broken line indicates differential characteristics from the transmission side to the reception side according to the aforementioned comparative example.

As indicated by an arrow I, it can be seen that the second preferred embodiment effectively improves the differential characteristics from the transmission side to the reception side, as compared to the comparative example.

Figure 9:
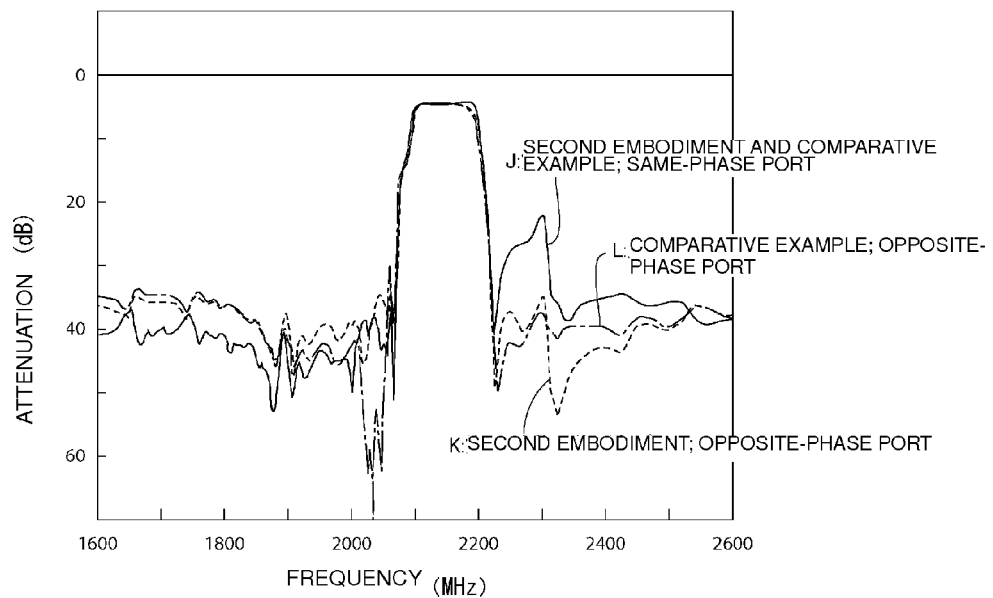
FIG. 9 is a diagram illustrating frequency characteristics for each of the first balanced signal terminal that has the same phase as the unbalanced signal terminal and the second balanced signal terminal that has the opposite phase from the unbalanced signal terminal in the duplexing device according to the second preferred embodiment, and illustrating frequency characteristics for each of a first balanced signal terminal that has the same phase as an unbalanced signal terminal and a second balanced signal terminal that has the opposite phase from the unbalanced signal terminal in a conventional duplexing device.
Figure 10:
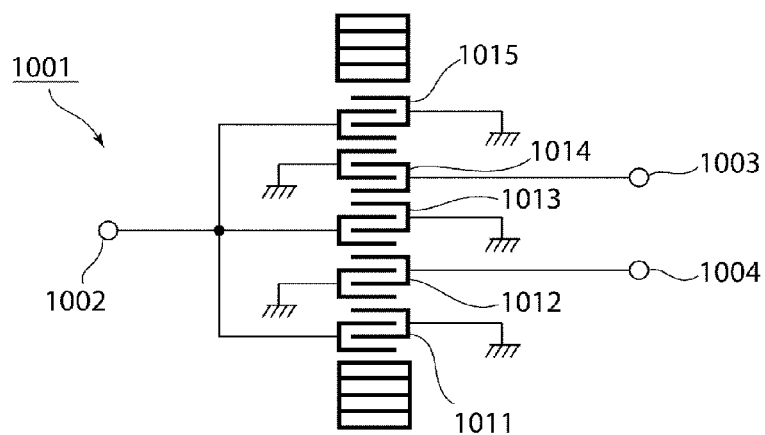
FIG. 10 is an overall configuration diagram illustrating a conventional unbalanced-balanced elastic wave device.
Figure 11:
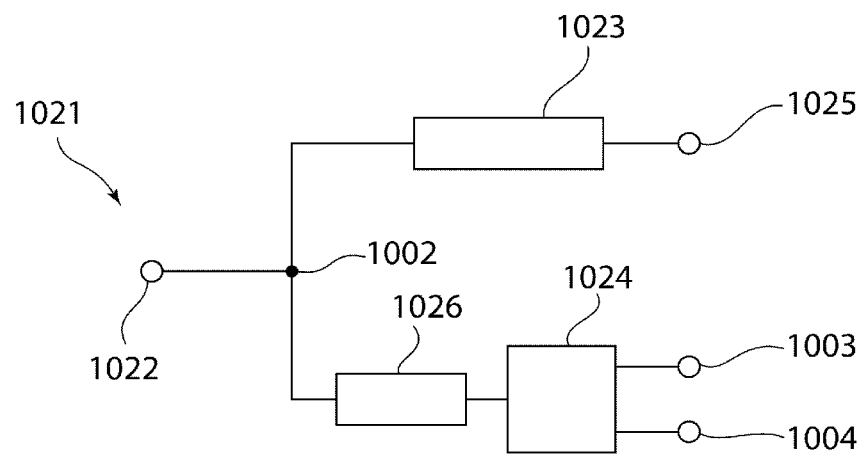
FIG. 11 is an overall configuration diagram illustrating a conventional duplexer.
Figure 12:
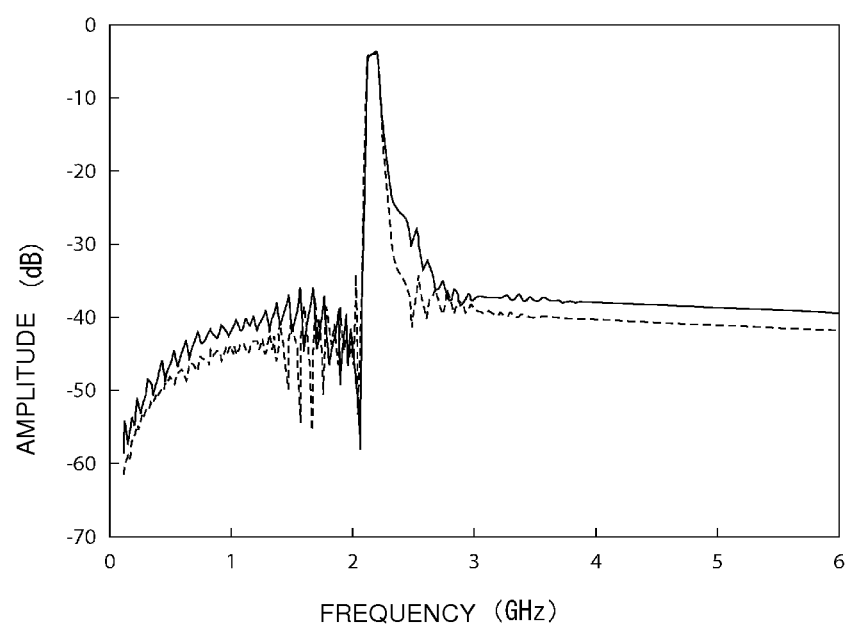
FIG. 12 is a diagram illustrating respective amplitude characteristics between an unbalanced signal terminal and first and second balanced signal terminals in a conventional elastic wave device.
Figure 13:
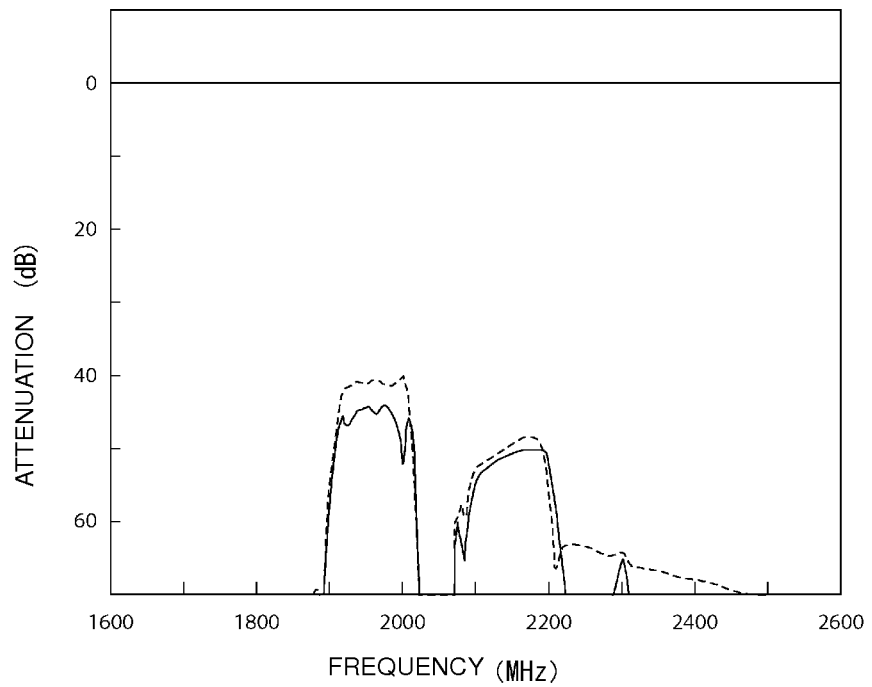
FIG. 13 is a diagram illustrating respective isolation characteristics between a transmission terminal and a first balanced signal terminal, and between the transmission terminal and a second balanced signal terminal, in a conventional duplexer.

In FIG. 9, a solid line J indicates amplitude characteristics of a signal flowing from the unbalanced signal terminal 2 to the first balanced signal terminal 5, which is a port having the same phase as the unbalanced signal terminal 2, in the duplexing device 41 according to the second preferred embodiment. The amplitude characteristics of a signal flowing from the unbalanced signal terminal 2 to the first balanced signal terminal that is a port having the same phase as the unbalanced signal terminal 2 according to the comparative example overlap with the amplitude characteristics of the second preferred embodiment, indicated by the solid line J. In FIG. 9, a broken line K indicates amplitude characteristics of a signal flowing from the unbalanced signal terminal 2 to the second balanced signal terminal 6, which is a port having the opposite phase from the unbalanced signal terminal 2, in the duplexing device 41 according to the second preferred embodiment. A dot-dash line L indicates amplitude characteristics of a signal flowing from the unbalanced signal terminal 2 to the second balanced signal terminal, which is a port having the opposite phase from the unbalanced signal terminal 2, according to the comparative example.

As can be seen from FIG. 9, according to the present preferred embodiment, the difference between amplitude characteristics from 1.6-2.0 GHz are reduced, in the same manner as in the first preferred embodiment. Furthermore, according to the second preferred embodiment, the differential characteristics are improved in higher frequencies, namely 2.3 GHz-2.5 GHz, than a pass-band as well. Further still, the attenuation is sufficiently high in the 1.9 GHz-2.0 GHz pass-band of the transmission filter circuit.

As shown in FIG. 9, the second preferred embodiment reduces the difference between amplitude characteristics in higher frequencies than the pass-band as well. Thus, the differential characteristics are improved in the 2.3 GHz-2.5 GHz range, as described above.

In various preferred embodiments of the present invention, the values of the first and second inductances L1 and L2 are preferably set so that the difference between the amplitude characteristics of signals obtained from the first and second balanced signal terminals 5 and 6 is lower than in a configuration in which the first and second inductances 31 and are not connected. However, it should be noted that it is desirable for the first and second inductances L1 and L2 to be different so that the respective amplitude characteristics are the same.

Likewise, the first and second capacities C1 and C2 of the first and second capacitances 42 and 43 may be selected so that the difference between the amplitude characteristics is lower than in an equivalent configuration in which the first and second capacitances 42 and 43 are not connected. In this case as well, it is desirable for the first and second capacities C1 and C2 to be selected so that the respective amplitude characteristics are the same.

Note that in the duplexing devices 1 and 41, the transmission filter circuit 4 is not limited to the stated circuit configuration, and various types of transmission filter circuits using surface acoustic wave elements, boundary acoustic wave elements, and the like can be used, for example. The transmission filter circuit 4 may also be configured using a filter element aside from an elastic wave element, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An unbalanced-balanced elastic wave device comprising:
    an unbalanced signal terminal and first and second balanced signal terminals;
    a piezoelectric substrate;
    first, second, third, fourth and fifth interdigital transducers disposed on the piezoelectric substrate in that order along an elastic wave propagation direction; and
    first and second reflectors disposed on either side, in the elastic wave propagation direction, of an area in which the first, second, third, fourth and fifth interdigital transducers are disposed; wherein
    one end of each of the first, third, and fifth interdigital transducers is connected in common to the unbalanced signal terminal;
    one end of the second interdigital transducer is connected to the first balanced signal terminal;
    one end of the fourth interdigital transducer is connected to the second balanced signal terminal;
    the other end of each of the first to fifth interdigital transducers is connected to a ground potential;
    a signal obtained from the first balanced signal terminal and a signal obtained from the second balanced signal terminal have opposite phases;
    the device further comprises first and second inductances respectively connected between the other ends of the first and fifth interdigital transducers and the ground potential, the respective other ends of the first and fifth interdigital transducers being electrically insulated on the piezoelectric substrate;
    a first capacitance connected between the unbalanced signal terminal and the first balanced signal terminal; and
    a second capacitance connected between the unbalanced signal terminal and the second balanced signal terminal; wherein
    a first inductance value of the first inductance and a second inductance value of the second inductance are different; and
    a first capacity of the first capacitance and a second capacity of the second capacitance are different.

2. The elastic wave device according to claim 1, wherein the first inductance is provided between the ground potential and the other end of the first interdigital transducer disposed so as to have a same phase as a signal inputted to the unbalanced signal terminal;

the second inductance is provided between the ground potential and the other end of the fifth interdigital transducer disposed so as to have an opposite phase from a signal inputted to the unbalanced terminal; and the inductance value of the first inductance is lower than the inductance value of the second inductance.

3. The elastic wave device according to claim 2, wherein a signal inputted to the first capacity of the first capacitance has a same phase as the signal inputted to the unbalanced signal terminal;

a signal inputted to the second capacity of the second capacitance has an opposite phase from the signal inputted to the unbalanced signal terminal; and the first capacity is lower than the second capacity.

4. A duplexing device comprising:

an antenna terminal;

a transmission filter circuit connected to the antenna terminal; and a reception filter circuit connected to the antenna terminal; wherein the reception filter circuit includes the elastic wave device according to claim 3.

5. A duplexing device comprising:

an antenna terminal;

a transmission filter circuit connected to the antenna terminal; and a reception filter circuit connected to the antenna terminal; wherein the reception filter circuit includes the elastic wave device according to claim 2.

6. A duplexing device comprising:

an antenna terminal;

a transmission filter circuit connected to the antenna terminal; and a reception filter circuit connected to the antenna terminal; wherein the reception filter circuit includes the elastic wave device according to claim 1.

* * * * *